US012647094B2

(12) United States Patent
Wloczysiak et al.

(10) Patent No.: US 12,647,094 B2
(45) Date of Patent: Jun. 2, 2026

(54) FILTER MODULE WITH ENHANCED TEMPERATURE RUGGEDNESS IN SMALLER SIZE

(71) Applicant: SKYWORKS GLOBAL PTE. LTD., Singapore (SG)

(72) Inventors: Stephane Richard Marie Wloczysiak, Irvine, CA (US); Yiliu Wang, Irvine, CA (US); Kwang Jae Shin, Yongin (KR); Nan Wu, Irvine, CA (US)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 218 days.

(21) Appl. No.: 18/396,294

(22) Filed: Dec. 26, 2023

(65) Prior Publication Data

US 2024/0235518 A1     Jul. 11, 2024

Related U.S. Application Data

(60) Provisional application No. 63/478,600, filed on Jan. 5, 2023.

(51) Int. Cl.
*H03H 9/02* (2006.01)
*H03H 9/205* (2006.01)
*H03H 9/56* (2006.01)

(52) U.S. Cl.
CPC .... *H03H 9/02102* (2013.01); *H03H 9/02448* (2013.01); *H03H 9/02834* (2013.01); *H03H 9/205* (2013.01); *H03H 9/568* (2013.01)

(58) Field of Classification Search
CPC .... H03H 9/02102; H03H 9/205; H03H 9/568; H03H 9/02448; H03H 9/02834
USPC .......................................... 333/187; 310/446
See application file for complete search history.

(56) References Cited

U.S. PATENT DOCUMENTS

| | | | | |
|---|---|---|---|---|
| 11,437,976 | B2 * | 9/2022 | Kaneda | .............. H03H 9/02834 |
| 2017/0244387 | A1 * | 8/2017 | Matsuda | ................ H03H 9/173 |
| 2020/0358424 | A1 * | 11/2020 | Kaneda | ................... H03H 9/25 |

* cited by examiner

*Primary Examiner* — Andrea Lindgren Baltzell
*Assistant Examiner* — Victor Cole
(74) *Attorney, Agent, or Firm* — Lando & Anastasi, LLP

(57) ABSTRACT

A filter module comprises a first terminal, a second terminal, and a filter disposed along each signal path extending from the first terminal to the second terminal, the filter including a plurality of series resonators and a plurality of shunt resonators disposed between the series resonators and a ground, at least one resonator among the plurality of series resonators and the plurality of shunt resonators being a first type of resonator with a temperature compensating layer for better temperature coefficient of frequency, at least one resonator among the plurality of series resonators and the plurality of shunt resonators being a second type of resonator without a temperature compensating layer.

20 Claims, 9 Drawing Sheets

400

FILTER MODULE WITH ENHANCED TEMPERATURE RUGGEDNESS IN SMALLER SIZE

CROSS-REFERENCE TO RELATED APPLICATIONS

This application claims priority under 35 U.S.C. § 119(e) to U.S. Provisional Patent Application Ser. No. 63/478,600, titled "FILTER MODULE WITH ENHANCED TEMPERATURE RUGGEDNESS IN SMALLER SIZE," filed Jan. 5, 2023, the entire content of which is incorporated herein by reference for all purposes.

BACKGROUND

Technical Field

Aspects and embodiments disclosed herein relate to electronic systems, and in particular, to a filter module for use in radio frequency (RF) electronics.

Description of the Related Technology

Filters are used in radio frequency (RF) communication systems to allow signals to pass through at discreet frequencies and reject signals at frequencies outside of a specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic wave resonator filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter module include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In accordance with one aspect, there is provided a filter module. The filter module comprises a first terminal, a second terminal, and a filter disposed along each signal path extending from the first terminal to the second terminal. The filter includes a plurality of series resonators and a plurality of shunt resonators disposed between the series resonators and a ground, at least one resonator among the plurality of series resonators and the plurality of shunt resonators being a first type of resonator with a temperature compensating layer for better temperature coefficient of frequency, at least one resonator among the plurality of series resonators and the plurality of shunt resonators being a second type of resonator without a temperature compensating layer.

In some embodiments, each of the plurality of series resonators and the plurality of shunt resonators is one of a bulk acoustic wave (BAW) resonator, a film bulk acoustic wave resonator, and a solidly-mounted resonator (SMR).

In some embodiments, the filter is a bandpass filter, each of the plurality of the series resonators being the first type of resonator, and each of the plurality of shunt resonators being the second type of resonator.

In some embodiments, the filter is a bandpass filter, each of the plurality of the shunt resonators being the first type of resonator, and each of the plurality of series resonators being the second type of resonator.

In some embodiments, the filter is a notch filter, each of the plurality of the series resonators being the first type of resonator, and each of the plurality of shunt resonators being the second type of resonator.

In some embodiments, the filter is a notch filter, each of the plurality of the shunt resonators being the first type of resonator, and each of the plurality of series resonators being the second type of resonator.

In some embodiments, the at least one of the plurality of series resonators and the plurality of shunt resonators being the first type of resonator includes the resonator most responsible for raising a skirt steepness or a channel insertion loss of the filter.

In some embodiments, the at least one of the plurality of series resonators and the plurality of shunt resonators being the first type of resonator includes a series resonator that is disposed between series resonators of the second type connected to the first terminal or the second terminal.

In some embodiments, the at least one of the plurality of series resonators and the plurality of shunt resonators being the first type of resonator includes a shunt resonator that is disposed between shunt resonators of the second type.

In some embodiments, the filter includes a plurality of first type of resonators with a temperature compensating layer, and at least two of the plurality of first type of resonators have different thicknesses of their respective temperature compensating layers.

In some embodiments, the plurality of first type of resonators includes a plurality of first type of series resonators, and a thickness of the series resonator most responsible for raising a skirt steepness or a channel insertion loss of the filter is thicker than that of other series resonators of the second type.

In some embodiments, the plurality of first type of resonators includes a plurality of first type of shunt resonators, and a thickness of the shunt resonator most responsible for raising a skirt steepness or a channel insertion loss of the filter is thicker than that of other shunt resonators of the second type.

In accordance with another aspect, there is provided a radio frequency module. The radio frequency module comprises a packaging board configured to receive a plurality of components, and a filter module implemented on the packaging board. The filter module includes a first terminal, a second terminal, and a filter disposed along each signal path extending from the first terminal to the second terminal, the filter including a plurality of series resonators and a plurality of shunt resonators disposed between the series resonators and a ground, at least one resonator among the plurality of series resonators and the plurality of shunt resonators being a first type of resonator with a temperature compensating layer for better temperature coefficient of frequency, at least one resonator among the plurality of series resonators and the plurality of shunt resonators being a second type of resonator without a temperature compensating layer.

In some embodiments, the radio frequency module is a front-end module.

In some embodiments, each of the plurality of series resonators and the plurality of shunt resonators is one of a bulk acoustic wave (BAW) resonator, a film bulk acoustic wave resonator, and a solidly-mounted resonator (SMR).

In some embodiments, the filter is a bandpass filter, each of the plurality of the series resonators being the first type of resonator, and each of the plurality of shunt resonators being the second type of resonator.

In some embodiments, the filter is a bandpass filter, each of the plurality of the shunt resonators being the first type of resonator, and each of the plurality of series resonators being the second type of resonator.

In some embodiments, the filter is a notch filter, each of the plurality of the series resonators being the first type of resonator, and each of the plurality of shunt resonators being the second type of resonator.

In some embodiments, the filter is a notch filter, each of the plurality of the shunt resonators being the first type of resonator, and each of the plurality of series resonators being the second type of resonator.

In some embodiments, the at least one of the plurality of series resonators and the plurality of shunt resonators being the first type of resonator includes the resonator most responsible for raising a skirt steepness or a channel insertion loss of the filter.

In some embodiments, the at least one of the plurality of series resonators and the plurality of shunt resonators being the first type of resonator includes a series resonator that is disposed between series resonators of the second type connected to the first terminal or the second terminal.

In some embodiments, the at least one of the plurality of series resonators and the plurality of shunt resonators being the first type of resonator includes a shunt resonator that is disposed between shunt resonators of the second type.

In some embodiments, the filter includes a plurality of first type of resonators with a temperature compensating layer, and at least two of the plurality of first type of resonators have different thicknesses for their respective temperature compensating layers.

In some embodiments, the plurality of first type of resonators includes a plurality of first type of series resonators, and a thickness of the series resonator most responsible for raising a skirt steepness or a channel insertion loss of the filter is thicker than that of other series resonators of the second type.

In some embodiments, the plurality of first type of resonators includes a plurality of first type of shunt resonators, and a thickness of the shunt resonator most responsible for raising a skirt steepness or a channel insertion loss of the filter is thicker than that of other shunt resonators of the second type.

In accordance with another aspect, there is provided a mobile device. The mobile device comprises an antenna configured to receive a radio frequency signal, and a front end system configured to communicate with the antenna, the front end system including a filter module including a first terminal, a second terminal, and a filter disposed along each signal path extending from the first terminal to the second terminal. The filter includes a plurality of series resonators and a plurality of shunt resonators disposed between the series resonators and a ground, at least one resonator among the plurality of series resonators and the plurality of shunt resonators being a first type of resonator with a temperature compensating layer for better temperature coefficient of frequency, at least one resonator among the plurality of series resonators and the plurality of shunt resonators being a second type of resonator without a temperature compensating layer.

In some embodiments, each of the plurality of series resonators and the plurality of shunt resonators is one of a bulk acoustic wave (BAW) resonator, a film bulk acoustic wave resonator, and a solidly-mounted resonator (SMR).

In some embodiments, the filter is a bandpass filter, each of the plurality of the series resonators being the first type of resonator, and each of the plurality of shunt resonators being the second type of resonator.

In some embodiments, the filter is a bandpass filter, each of the plurality of the shunt resonators being the first type of resonator, and each of the plurality of series resonators being the second type of resonator.

In some embodiments, the filter is a notch filter, each of the plurality of the series resonators being the first type of resonator, and each of the plurality of shunt resonators being the second type of resonator.

In some embodiments, the filter is a notch filter, each of the plurality of the shunt resonators being the first type of resonator, and each of the plurality of series resonators being the second type of resonator.

In some embodiments, the at least one of the plurality of series resonators and the plurality of shunt resonators being the first type of resonator includes the resonator most responsible for raising a skirt steepness or a channel insertion loss of the filter.

In some embodiments, the at least one of the plurality of series resonators and the plurality of shunt resonators being the first type of resonator includes a series resonator that is disposed between series resonators of the second type connected to the first terminal or the second terminal.

In some embodiments, the at least one of the plurality of series resonators and the plurality of shunt resonators being the first type of resonator includes a shunt resonator that is disposed between shunt resonators of the second type.

In some embodiments, the filter includes a plurality of first type of resonators with a temperature compensating layer, and at least two of the plurality of first type of resonators have different thicknesses for their respective temperature compensating layers.

In some embodiments, the plurality of first type of resonators includes a plurality of first type of series resonators, and a thickness of the series resonator most responsible for raising a skirt steepness or a channel insertion loss of the filter is thicker than that of other series resonators of the second type.

In some embodiments, the plurality of first type of resonators includes a plurality of first type of shunt resonators, and a thickness of the shunt resonator most responsible for raising a skirt steepness or a channel insertion loss of the filter is thicker than that of other shunt resonators of the second type.

DETAILED DESCRIPTION OF EMBODIMENTS

Figure 1:
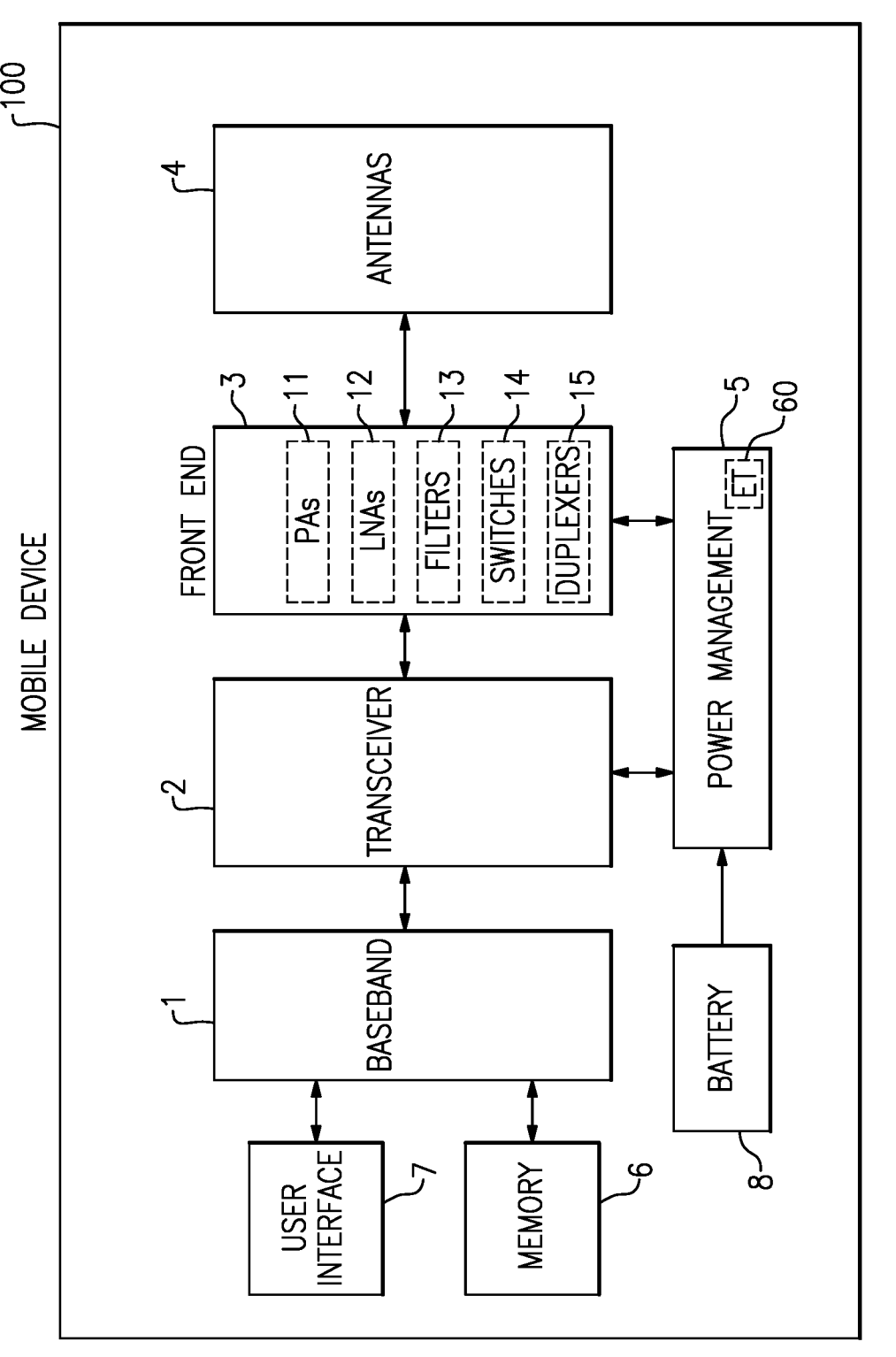
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 1, a transceiver 2, a front end system 3, antennas 4, a power management system 5, a memory 6, a user interface 7, and a battery 8.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 2 generates RF signals for transmission and processes incoming RF signals received from the antennas 4. It will be understood that various functionalities associated with the transmission and receiving of RF signals can be achieved by one or more components that are collectively represented in FIG. 1 as the transceiver 2. In one example, separate components (for instance, separate circuits or dies) can be provided for handling certain types of RF signals.

The front end system 3 aids in conditioning signals transmitted to and/or received from the antennas 4. In the illustrated embodiment, the front end system 3 includes power amplifiers (PAS) 11, low noise amplifiers (LNAs) 12, filters 13, switches 14, and duplexers 15. However, other implementations are possible.

For example, the front end system 3 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 4 can include antennas used for a wide variety of types of communications. For example, the antennas 4 can include antennas for transmitting and/or receiving signals associated with a wide variety of frequencies and communications standards.

In certain implementations, the antennas 4 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 3 can include phase shifters having variable phase controlled by the transceiver 2. Additionally, the phase shifters may be controlled to provide beam formation and directivity for transmission and/or reception of signals using the antennas 4. For example, in the context of signal transmission, the phases of the transmit signals provided to the antennas 4 are controlled such that radiated signals from the antennas 4 combine using constructive and destructive interference to generate an aggregate transmit signal exhibiting beam-like qualities with more signal strength propagating in a given direction. In the context of signal reception, the phases are controlled such that more signal energy is received when the signal is arriving at the antennas 4 from a particular direction. In certain implementations, the antennas 4 include one or more arrays of antenna elements to enhance beamforming.

The baseband system 1 is coupled to the user interface 7 to facilitate processing of various user input and output (I/O), such as voice and data. The baseband system 1 provides the transceiver 2 with digital representations of transmit signals, which the transceiver 2 processes to generate RF signals for transmission. The baseband system 1 also processes digital representations of received signals provided by the transceiver 2. As shown in FIG. 1, the baseband system 1 is coupled to the memory 6 to facilitate operation of the mobile device 100.

The memory 6 can be used for a wide variety of purposes, such as storing data and/or instructions to facilitate the operation of the mobile device 100 and/or to provide storage of user information.

The power management system 5 provides a number of power management functions of the mobile device 100. The power management system 5 of FIG. 1 includes an envelope tracker 60. As shown in FIG. 1, the power management system 5 receives a battery voltage form the battery 8. The battery 8 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2A:
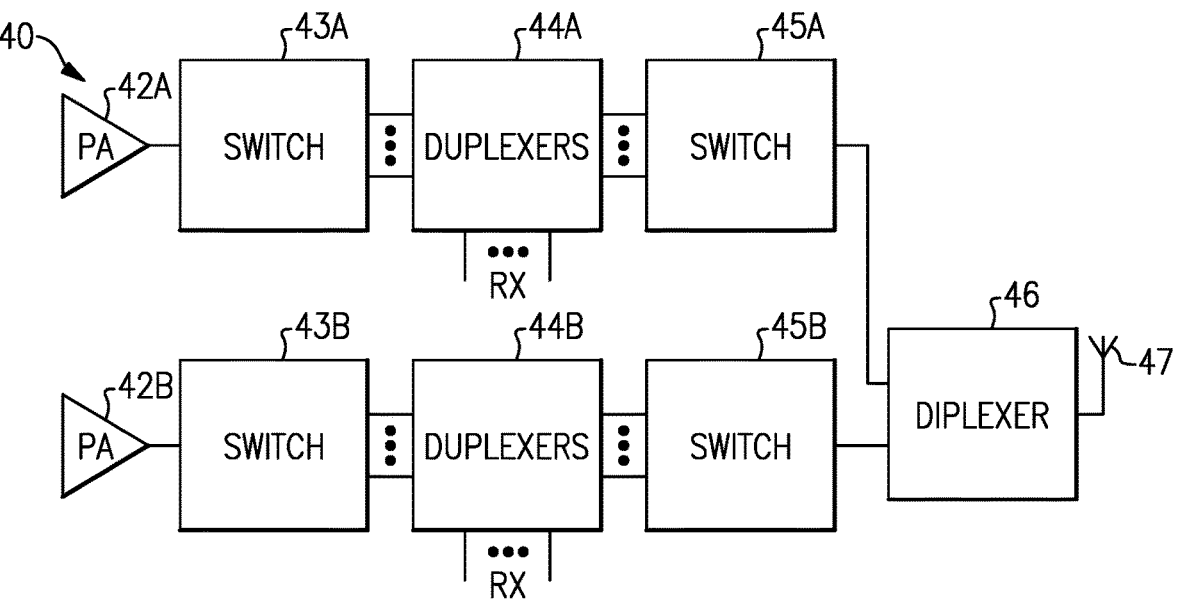
FIG. 2A is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexer 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
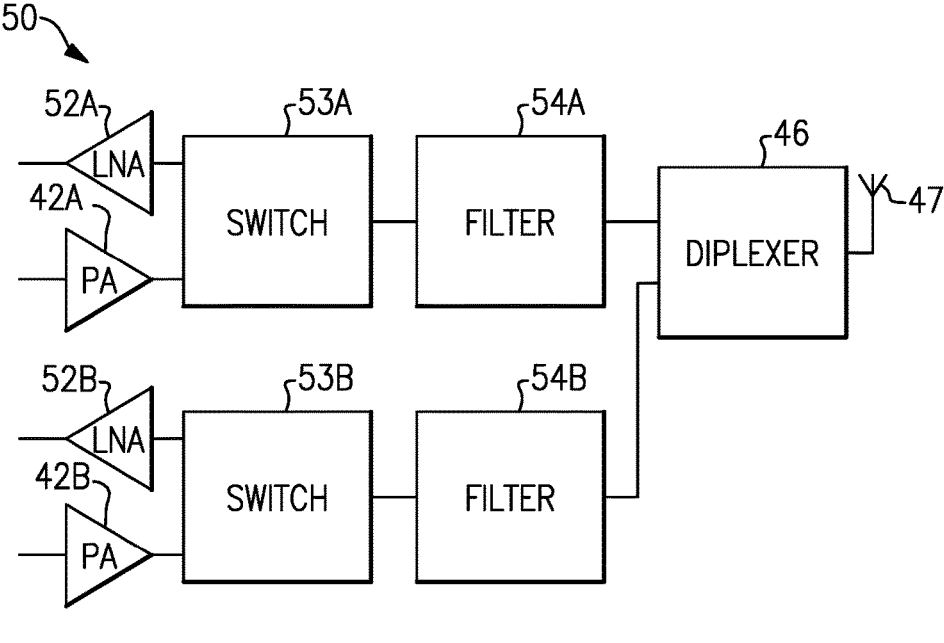
FIG. 2B is a schematic diagram of a carrier aggregation system.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
FIG. 2C is a schematic diagram of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
FIG. 2D is a schematic diagram of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG.

2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 44A and 44B are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A is coupled to separate throws of the switch 75. Similarly, the illustrated duplexers 44B include a plurality of duplexers coupled to separate throws of the switch 75. Alternatively, instead of duplexers being coupled to each throw the switch 75 as illustrated in FIG. 2D, one or more individual filters of a multiplexer can be coupled to a dedicated throw of a switch coupled between the multiplexer and a common node. For instance, in some applications, such a switch could have twice as many throws as the illustrated switch 75.

Figures 3A, 3B:
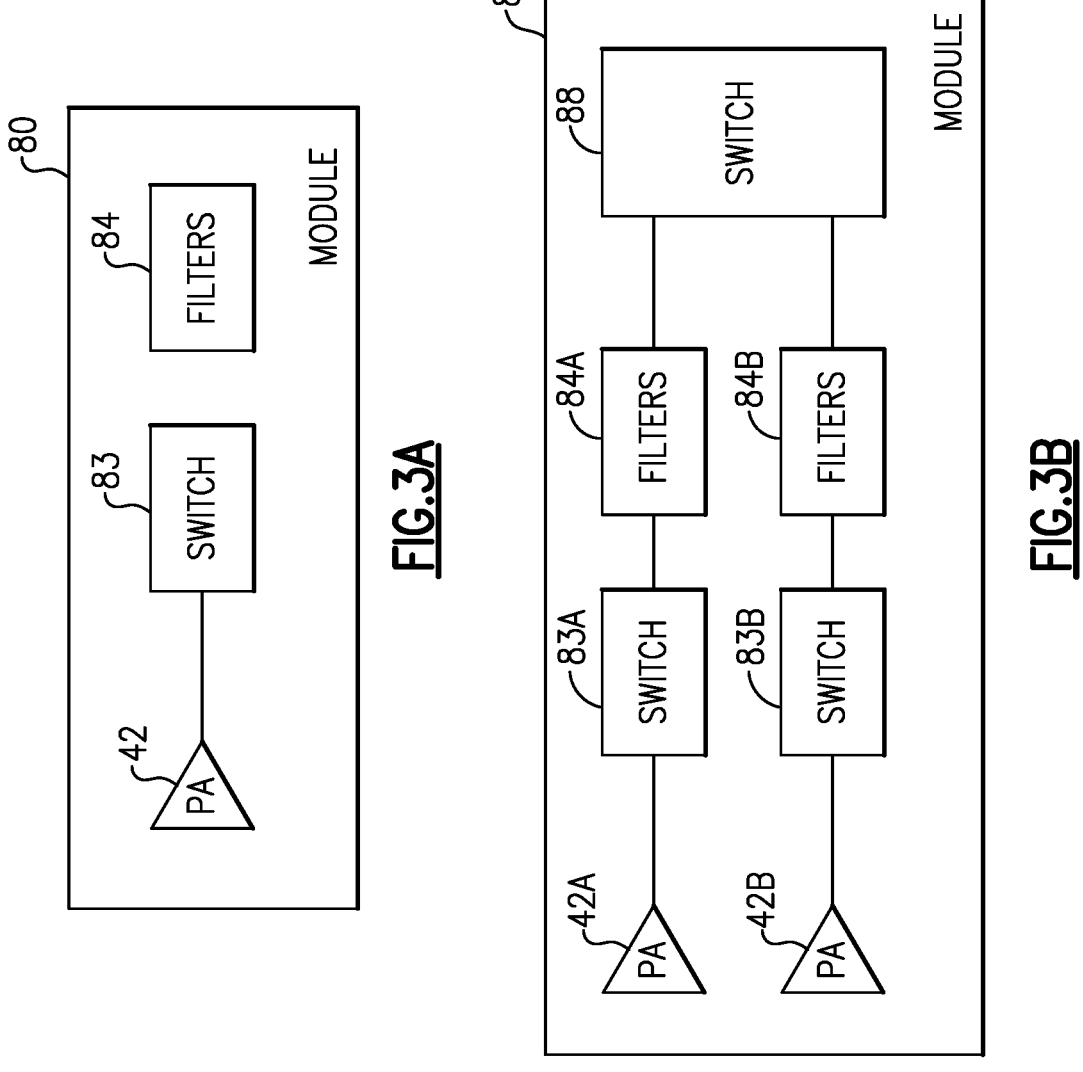
FIG. 3A is a schematic block diagram of a module that includes a filter.
FIG. 3B is a schematic block diagram of a module that includes a filter.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 3A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

For BAW filters, shunt resonators and series resonators are used with quite similar stacks. For example, the BAW filters can be fabricated by growth techniques, such as molecular beam epitaxy (MBE) growth techniques, or can be fabricated using piezoelectric layers (PZL) or metal-top electrodes (MTE). In order to create different resonant frequency (Fs) groups, optical microfiber (MF) and tapered fiber (TF) layers can be varied. Meanwhile, performances of the filter can be optimized by size or frames selections, which affects quality factor at resonance (Qs), quality factor at anti-resonance (Qp), and electromechanical coupling coefficient (Kt2). For certain filter applications, the filter skirt should be steeper, or shift less with temperature, to improve characteristics of ruggedness, power handling, etc.

Conventionally, to improve the steepness of the filter skirt, it is known to increase the metal raised frame width (MRaW) and oxide raised frame width (ORaW) to reduce Kt2. With stronger transverse electric (TE) modes, this may impact carrier aggregation (CA) filters and degrade filter low channel insertion loss if it is a band with big resolution bandwidth (RBW). It is also known to add resonator capacitors or metal-insulator-metal (MIM) capacitors. This will increase the die size and sometimes such capacitors may be the first to fail during ruggedness tests. Furthermore, it is also known to add temperature compensating (TC) layers to the resonators, to reduce Kt2 and improve the temperature coefficient of frequency (TCF). For some bands having big RBW, high Kt2 is desirable to get a good contour size and return loss (RL). However, adding TC layers for all the resonators will degrade contour size.

Hereinafter, a filter module according to the present disclosure having enhanced temperature ruggedness while maintaining a smaller contour size is provided.

According to the present disclosure, in a filter, instead of using TC layers for all resonators, a TC layer can be selectively used for each resonator. In this manner, Q and Kt2 for different resonators will be provided with degrees of freedom in design. As Kt2 is different for the TC resonator, even if it is in the same TF group (same Fs), the anti-resonant frequency (Fp) will be different, which can help to improve, for example, contour size and rejection.

According to the present disclosure, in a filter, instead of all resonators with a TC layer, or without a TC layer, the TC layer thickness is applied differently for various resonators in the filter. According to some embodiments, Q and Kt2 for different resonators can be provided with degrees of freedom in design. As Kt2 is different for the TC resonator, even if it is in the same TF group (same Fs), Fp will be different, which can help to improve for example contour size and rejection. TCF can be tailored in the design stage, leading to enhanced TCF for critical performance characteristics, and worse TCF or no TCF for less important performance characteristics.

Figure 4:
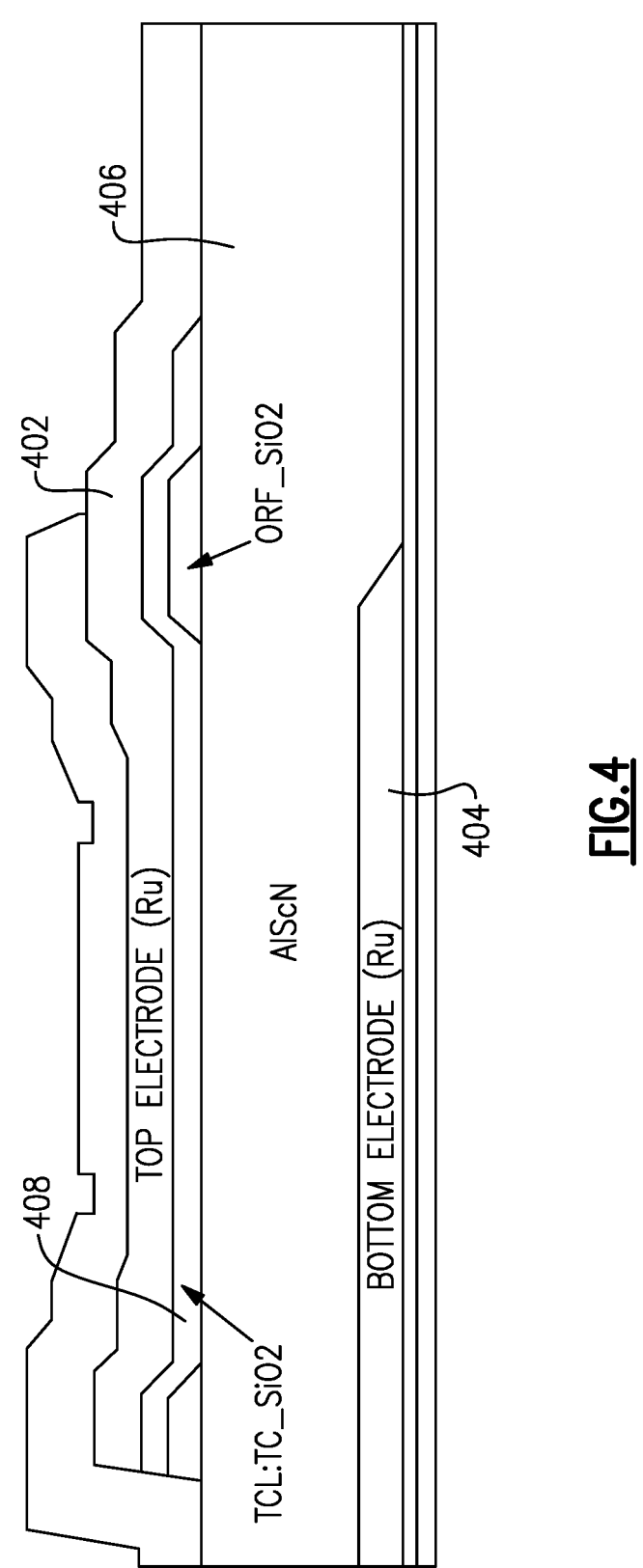
FIG. 4 is a schematic diagram of resonator according to an embodiment of the present disclosure.

FIG. 4 is a schematic diagram of resonator according to an embodiment of the present disclosure. As shown in FIG. 4, the resonator 400 according to the present disclosure includes a top electrode 402, a bottom electrode 404, an acoustic film layer 406 disposed therebetween, and a temperature compensating (TC) layer 408 disposed between the top electrode 402 and the acoustic film layer 406.

The TC layer 408 may be configured to have a positive temperature coefficient. A temperature coefficient describes the relative change of a physical property that is associated with a given change in temperature. A positive temperature coefficient for a material means that its resistance increases with an increase in temperature. The TC layer 408 may include, for example, silicon dioxide. More specifically, the TC layer 408 may include pure silicon dioxide or doped silicon dioxide.

Figure 5:
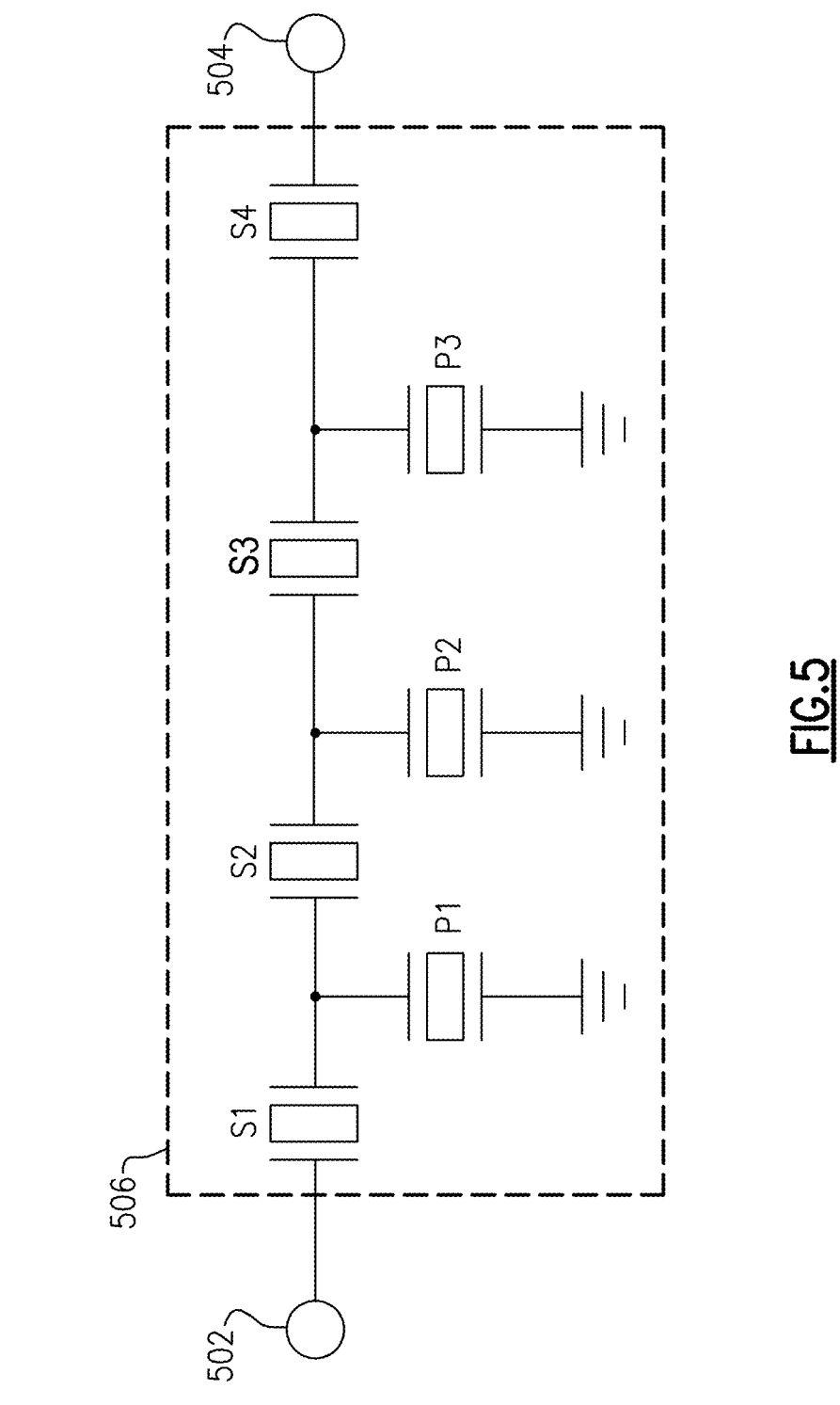
FIG. 5 is a schematic diagram of a filter module according to an embodiment of the present disclosure.

FIG. 5 is a schematic diagram of a filter module according to an embodiment of the present disclosure. According to the present disclosure, the filter module may have enhanced temperature ruggedness while maintaining a smaller contour size, by combining the resonator(s) with a TC layer and the resonator(s) without a TC layer in a single filter module. The filter module according to an embodiment of the present disclosure includes a first terminal 502, a second terminal 504, and a filter 506.

The first terminal 502 may be configured to receive a radio frequency (RF) signal. The second terminal 504 may be configured to output a filtered RF signal. The second terminal 504 may be configured to be connected to an antenna. However, the terms are defined for the purpose of clear distinction, so that the functionality of the first terminal 502 and the second terminal 504 may be also vice versa.

The filter 506 is disposed along each signal path extending from the first terminal 502 to the second terminal 504. The filter 506 may include a plurality of series resonators S1-S4 and a plurality of shunt resonators P1-P3 disposed between the series resonators S1-S4 and ground.

At least one resonator among the plurality of series resonators and the plurality of shunt resonators may be a first type of resonator with a temperature compensating (TC) layer. The first type of resonator may be defined as a resonator having the TC layer. The TC layer may be used for achieving a better temperature coefficient of frequency (TCF).

At least one resonator among the plurality of series resonators and the plurality of shunt resonators may be a second type of resonator without the TC layer. The second type of resonator may be defined as a resonator not having the TC layer.

It should be noted that the number of the first type of resonator is not limited to a specific example, and any one of the resonators can be the first type resonator.

According to an embodiment of the present disclosure, the filter 506 may be a Co-PKG filter. As the Kt2 of the filter is determined depending on the resonators with or without a TC layer, this creates one more group of Fp for free.

According to an embodiment of the present disclosure, the filter 506 may be a band pass filter. In this embodiment, all series resonators may be the first type of resonator and all shunt resonators may be the second type of resonator. In this case, the filter upper (right) skirt steepness as well as the temperature margin can be improved. In a different implementation, all shunt resonators may be the first type of resonator and all series resonators may be the second type of resonator. In this implementation, the filter lower (left) skirt steepness as well as the temperature margin can be improved.

According to an embodiment of the present disclosure, the filter 506 may be a band rejection filter. In this embodiment, all series resonators may be the first type of resonator and all shunt resonators may be the second type of resonator. In this implementation, the filter lower (left) skirt steepness as well as the temperature margin can be improved. In a different implementation, all shunt resonators may be the first type of resonator and all series resonators may be the second type of resonator. In this implementation, the filter upper (right) skirt steepness as well as the temperature margin can be improved.

Therefore, depending on its requirements with respect to filter performance, the different resonators of the filter may selectively have the TC layer.

In one example, only one series resonator may be the first type of resonator and the rest of the series resonators and the plurality of shunt resonators may be the second type of resonators. In this example, the first type of resonator may be the resonator most responsible for raising a skirt steepness of the filter 506 or channel insertion loss of the filter 506. More specifically, the only first type of series resonator may be mainly responsible for the filter right skirt steepness. According to an embodiment, the filter 506 is a passband filter, and the series resonator S3 that is disposed between second type of series resonators S1, S4 connected to the first terminal 502 and the second terminal 504, respectively, may be the only first type of resonator. By applying a TC layer for the series resonator S3, the filter right skirt will shift less with temperature variation, i.e., at high temperature there will be less shift down in frequency, thus aiding in improving the filter ruggedness. Equally, not applying the TC layer for all resonators will aid in reducing the contour size of the filter.

In another example, only one shunt resonator may be the first type of resonator and the rest of the shunt resonators and the plurality of series resonators may be the second type of resonator. In this example, the first type of resonator may be the resonator most responsible for raising a skirt steepness of the filter 506 or channel insertion less of the filter 506. More specifically, the only first type of shunt resonator may be mainly responsible for the filter left skirt steepness. According to an embodiment, the filter 506 is a passband filter, and the shunt resonator P2 that is disposed between second type shunt resonators P1, P3 may be the only first type of resonator. By applying a TC layer for the shunt resonator P2, the filter left skirt will shift less with temperature variation, i.e., at high temperature there will be less shift down in frequency, thus aiding in improving the filter ruggedness. Equally, not applying the TC layer for all resonators will aid in reducing the contour size of the filter.

According to an embodiment, a number of the first type of resonator may be plural. In this embodiment, each of the first type of resonator may have different thickness of TC layers. By applying different thicknesses of TC layers for resonators in a filter, the design of the filter can be more flexible. In addition, as Kt2 is determined differently for the TC resonator, even if it is in the same TF group (same Fs), Fp will be different, thereby helping to improve, inter alia, the contour and rejection of the filter. Furthermore, the temperature coefficient of frequency (TCF) of the filter can be tailored depending on its requirements with high flexibility.

According to an embodiment of the present disclosure, the filter 506 may be a Co-PKG filter. As the Kt2 of the filter is determined depending on the presence of a TC layer and the thickness thereof, an additional group of Fp is created.

According to an embodiment of the present disclosure, the filter 506 may be a bandpass filter. In this embodiment, all series resonators may be the first type of resonator and all shunt resonators may be the second type of resonator. In this embodiment, the filter upper (right) skirt steepness as well as the temperature margin can be improved. The thicknesses of all TC layers may all be mutually different. Alternatively, at least two TC layers may have the same thickness. In other implementations, all shunt resonators may be the first type of resonator with different TC layer thicknesses and all series resonators may be the second type of resonator. In this implementation, the filter lower (left) skirt steepness as well as the temperature margin can be improved.

In one example, the filter 506 may include a plurality of first type series resonators, and each of the first type series resonators may have a different thickness of its TC layer. More specifically, a thickness of the TC layer of the series resonator most responsible for raising a skirt steepness of the filter or channel insertion loss of the filter may be thicker than that of other first type series resonators. More specifically, the first type series resonator with the thicker TC layer may be mainly responsible for the filter right skirt steepness. According to an embodiment, the filter 506 is a bandpass filter, and the series resonator S3 that is disposed between second type of series resonators S1, S4 connected to the first terminal 502 and the second terminal 504 respectively may have the thickest TC layer. By applying the thickest TC layer for the series resonator S3, the filter right skirt will shift less with temperature variation, i.e., at high temperature there will be less shift down in frequency, thereby improving the filter ruggedness. Equally, applying TC layer with different thicknesses will aid in reducing the contour size of the filter.

In addition, a thickness of the TC layer of the shunt resonator most responsible for raising a skirt steepness of the filter or channel insertion loss of the filter may be thicker than that of the other shunt resonators or the other shunt resonators may be the second type of resonator. More specifically, the first type shunt resonator with the thicker TC layer may be mainly responsible for the filter left skirt steepness. According to an embodiment, the filter 506 is a bandpass filter, and the shunt resonator P2 that is disposed between second type of shunt resonators P1, P3 may have a TC layer. By applying the TC layer for the shunt resonator P2, the filter left skirt will shift less with temperature variation, i.e., at high temperature there will be less shift down in frequency, thereby improving the filter rejection as well as the isolation performance. Equally, applying the TC layer with different thicknesses in different resonators will aid in reducing the contour size of the filter.

According to an embodiment of the present disclosure, the filter 506 may be a band rejection filter. In this embodiment, all series resonators may be the first type of resonator with different TC layer thicknesses and all shunt resonators may be the second type of resonator. In this embodiment, the filter lower (left) skirt steepness as well as the temperature margin can be improved. In alternative implementations, all shunt resonators may be the first type of resonator with different TC layer thicknesses and all series resonators may be the second type of resonator. In this case, the filter upper (right) skirt steepness as well as the temperature margin can be improved.

According to embodiments of the present disclosure, a filter module may have enhanced temperature ruggedness, while maintaining a smaller contour size, by combining the resonator(s) with a TC layer and the resonator(s) without a TC layer in a single filter module, and by applying different thicknesses to the TC layers.

Figure 6:
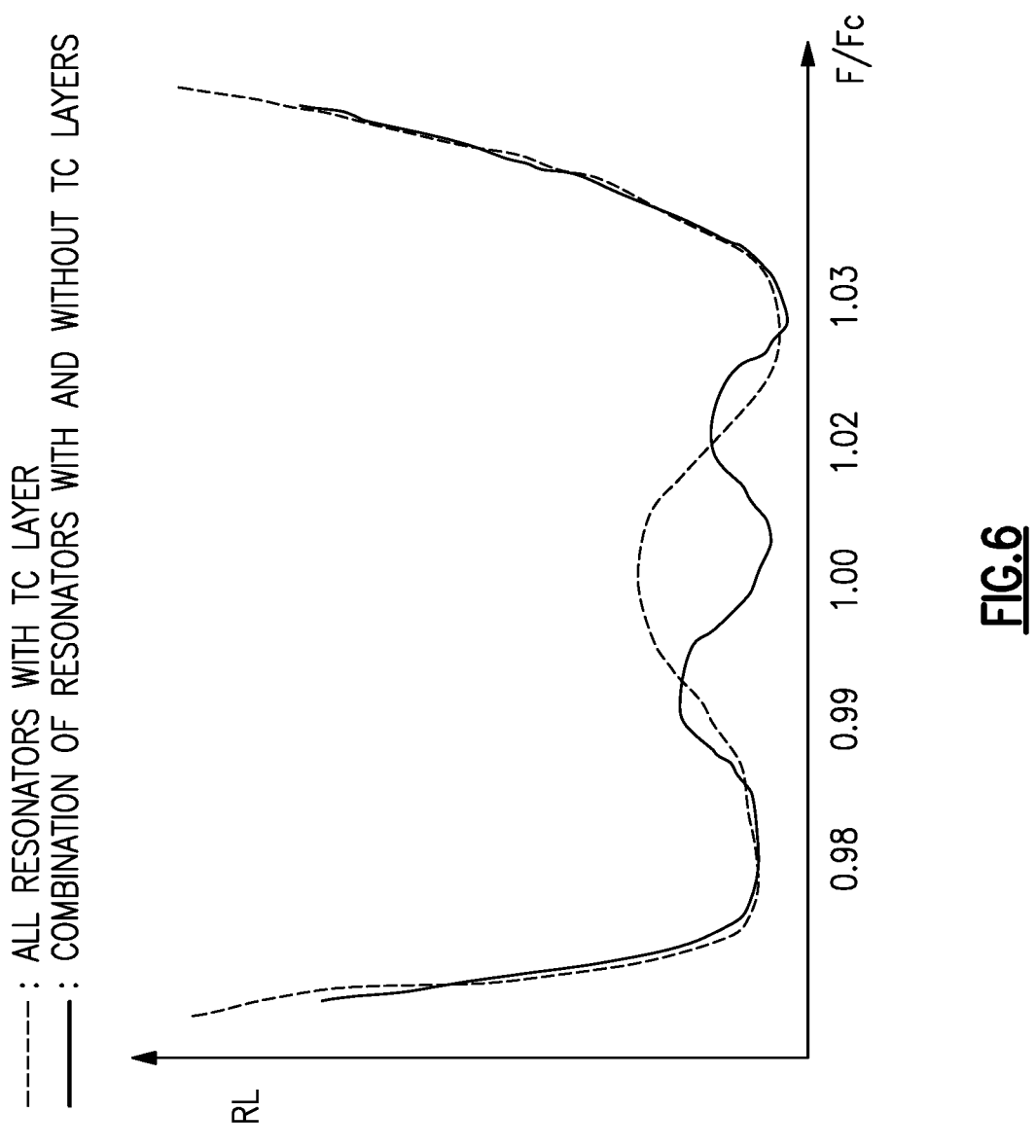
FIG. 6 is an example of graph illustrating a return loss of a filter module according to an embodiment of the present disclosure.

FIG. 6 is an example of graph illustrating a return loss of a filter module according to an embodiment of the present disclosure.

As shown in FIG. 6, the return loss of a filter with combination of first and second types of resonators has been improved compared to a conventional filter having resonators that all include a TC layer.

Figure 7A:
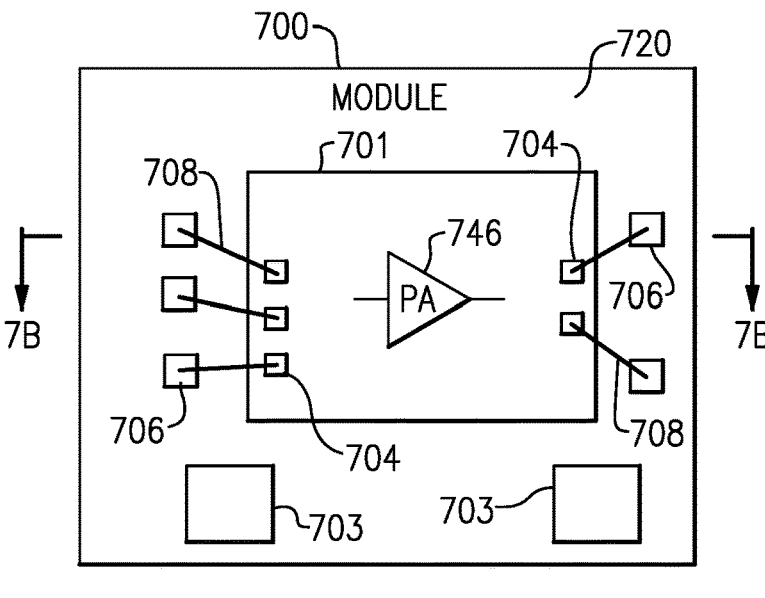
FIG. 7A is a schematic diagram of one embodiment of a packaged module.
Figure 7B:
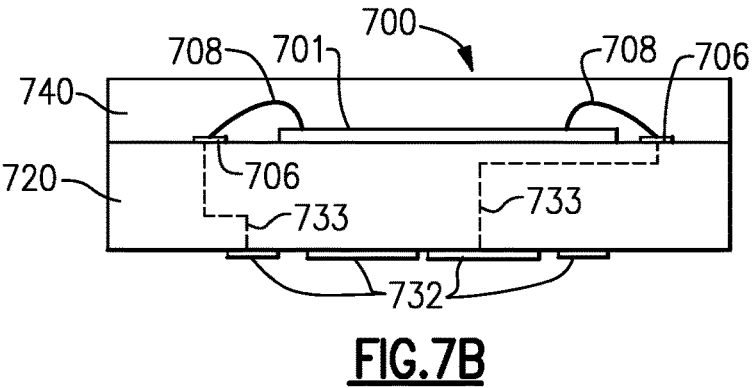
FIG. 7B is a schematic diagram of a cross-section of the packaged module of FIG. 7A taken along the lines 7B-7B.

FIG. 7A is a schematic diagram of one embodiment of a packaged module 700. FIG. 7B is a schematic diagram of a cross-section of the packaged module 700 of FIG. 7A taken along the lines 7B-7B.

The packaged module 700 includes an IC or die 701, surface mount components 703, wirebonds 708, a package substrate 720, and encapsulation structure 740. The package substrate 720 includes pads 706 formed from conductors disposed therein. Additionally, the die 701 includes pads 704, and the wirebonds 708 have been used to electrically connect the pads 704 of the die 701 to the pads 706 of the package substrate 720.

The die 701 includes a filter module, which can be implemented in accordance with any of the embodiments herein.

The packaging substrate 720 can be configured to receive a plurality of components such as the die 701 and the surface mount components 703, which can include, for example, surface mount capacitors and/or inductors.

As shown in FIG. 7B, the packaged module 700 is shown to include a plurality of contact pads 732 disposed on the side of the packaged module 700 opposite the side used to mount the die 701. Configuring the packaged module 700 in this manner can aid in connecting the packaged module 700 to a circuit board such as a phone board of a wireless device. The example contact pads 732 can be configured to provide RF signals, bias signals, power low voltage(s) and/or power high voltage(s) to the die 701 and/or the surface mount components 703. As shown in FIG. 7B, the electrically connections between the contact pads 732 and the die 701 can be facilitated by connections 733 through the package substrate 720. The connections 733 can represent electrical paths formed through the package substrate 720, such as connections associated with vias and conductors of a multilayer laminated package substrate.

In some embodiments, the packaged module 700 can also include one or more packaging structures to, for example, provide protection and/or facilitate handling of the packaged module 700. Such a packaging structure can include overmold or encapsulation structure 740 formed over the packaging substrate 720 and the components and die(s) disposed thereon.

It will be understood that although the packaged module 700 is described in the context of electrical connections based on wirebonds, one or more features of the present disclosure can also be implemented in other packaging configurations, including, for example, flip-chip configurations.

Figure 8:
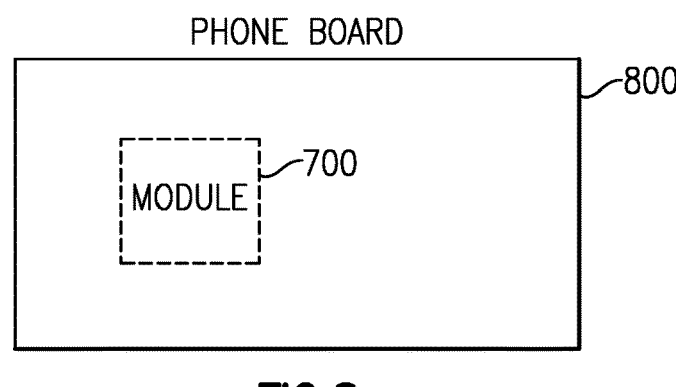
FIG. 8 is a schematic diagram of one embodiment of a phone board.

FIG. 8 is a schematic diagram of one embodiment of a phone board 800. The phone board 800 includes the module 700 shown in FIGS. 7A-7B attached thereto. Although not illustrated in FIG. 8 for clarity, the phone board 800 can include additional components and structures.

Applications

Some of the embodiments described above have provided examples in connection with wireless devices or mobile phones. However, the principles and advantages of the embodiments can be used for any other systems or apparatus that have needs for filters.

Such filters can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A filter module comprising:
a first terminal;
a second terminal; and
a filter disposed along each signal path extending from the first terminal to the second terminal, the filter including a plurality of series resonators and a plurality of shunt resonators disposed between the series resonators and a ground, at least one resonator among the plurality of series resonators and the plurality of shunt resonators being a first type of resonator with a temperature compensating layer, at least one resonator among the plurality of series resonators and the plurality of shunt resonators being a second type of resonator without a temperature compensating layer, the at least one of the plurality of series resonators and the plurality of shunt resonators being the first type of resonator including a series resonator that is disposed between series resonators of the second type connected to the first terminal and the second terminal, respectively, and that is a resonator most responsible for raising a skirt steepness or a channel insertion loss of the filter.

2. The filter module of claim 1 wherein each of the plurality of series resonators and the plurality of shunt resonators is one of a bulk acoustic wave (BAW) resonator, a film bulk acoustic wave resonator, and a solidly-mounted resonator (SMR).

3. The filter module of claim 1 wherein the filter is a bandpass filter, each of the plurality of shunt resonators being the second type of resonator.

4. The filter module of claim 1 wherein the filter is a bandpass filter, each of the plurality of the shunt resonators being the first type of resonator.

5. The filter module of claim 1 wherein the filter is a notch filter, each of the plurality of shunt resonators being the second type of resonator.

6. The filter module of claim 1 wherein the filter is a notch filter, each of the plurality of the shunt resonators being the first type of resonator.

7. The filter module of claim 1 wherein the filter includes a plurality of the first type of resonators with a temperature compensating layer, at least two of the plurality of the first type of resonators having different thicknesses of their respective temperature compensating layers, the plurality of the first type of resonators including a plurality of the first type of series resonators, a thickness of the temperature compensating layer of a series resonator most responsible for raising a skirt steepness or a channel insertion loss of the filter being thicker than that of other series resonators of the first type.

8. The filter module of claim 1 wherein the filter includes a plurality of the first type of resonators with a temperature compensating layer, at least two of the plurality of the first type of resonators having different thicknesses of their respective temperature compensating layers, the plurality of the first type of resonators including a plurality of the first type of shunt resonators, a thickness of the temperature compensating layer of a shunt resonator most responsible for raising a skirt steepness or a channel insertion loss of the filter being thicker than that of other shunt resonators of the first type.

9. The filter module of claim 1 wherein the at least one of the plurality of series resonators and the plurality of shunt resonators being the first type of resonator includes a shunt resonator that is disposed between shunt resonators of the second type.

10. A radio frequency module comprising:
a packaging substrate configured to receive a plurality of components; and
a filter module implemented on the packaging substrate, the filter module including a first terminal, a second terminal, and a filter disposed along each signal path extending from the first terminal to the second terminal, the filter including a plurality of series resonators and a plurality of shunt resonators disposed between the series resonators and a ground, at least one resonator among the plurality of series resonators and the plurality of shunt resonators being a first type of resonator with a temperature compensating layer, at least one resonator among the plurality of series resonators and the plurality of shunt resonators being a second type of resonator without a temperature compensating layer, the at least one of the plurality of series resonators and the plurality of shunt resonators being the first type of resonator being disposed between shunt resonators of the second type and being a shunt resonator most responsible for raising a skirt steepness or a channel insertion loss of the filter.

11. The radio frequency module of claim 10 wherein the radio frequency module is a front-end module.

12. The radio frequency module of claim 10 wherein the filter is a bandpass filter, each of the plurality of the series resonators being the first type of resonator.

13. A mobile device comprising:
an antenna configured to receive a radio frequency signal; and
a front end system configured to communicate with the antenna, the front end system including a filter module including a first terminal, a second terminal, and a filter disposed along each signal path extending from the first terminal to the second terminal, the filter including a plurality of series resonators and a plurality of shunt resonators disposed between the series resonators and a ground, at least one resonator among the plurality of series resonators and the plurality of shunt resonators being a first type of resonator with a temperature compensating layer, at least one resonator among the plurality of series resonators and the plurality of shunt resonators being a second type of resonator without a temperature compensating layer, the at least one of the plurality of series resonators and the plurality of shunt resonators being the first type of resonator being disposed between shunt resonators of the second type and being a shunt resonator most responsible for raising a skirt steepness or a channel insertion loss of the filter.

14. The radio frequency module of claim 10 wherein the filter includes a plurality of the first type of resonators with a temperature compensating layer, at least two of the plurality of the first type of resonators having different thicknesses of their respective temperature compensating layers, the plurality of the first type of resonators including a plurality of series resonators, a thickness of the temperature compensating layer of a series resonator most responsible for raising a skirt steepness or a channel insertion loss of the filter being thicker than that of other series resonators of the first type.

15. The radio frequency module of claim 10 wherein the filter includes a plurality of the first type of resonators with a temperature compensating layer, at least two of the plurality of the first type of resonators having different thicknesses of their respective temperature compensating layers, the plurality of the first type of resonators including a plurality of shunt resonators, a thickness of the temperature compensating layer of the shunt resonator most responsible for raising the skirt steepness or the channel insertion loss of the filter being thicker than that of other shunt resonators of the first type.

16. The mobile device of claim 13 wherein the filter includes a plurality of the first type of resonators with a temperature compensating layer, at least two of the plurality of the first type of resonators having different thicknesses of their respective temperature compensating layers, the plurality of the first type of resonators including a plurality of series resonators, a thickness of the temperature compensating layer of a series resonator most responsible for raising a skirt steepness or a channel insertion loss of the filter being thicker than that of other series resonators of the first type.

17. The mobile device of claim 13 wherein each of the plurality of series resonators and the plurality of shunt resonators is one of a bulk acoustic wave (BAW) resonator, a film bulk acoustic wave resonator, and a solidly-mounted resonator (SMR).

18. The mobile device of claim 13 wherein the filter is a notch filter, each of the plurality of the series resonators being the first type of resonator.

19. The mobile device of claim 13 wherein the filter is a notch filter, each of the plurality of the shunt resonators being the first type of resonator, and each of the plurality of series resonators being the second type of resonator.

20. The mobile device of claim 13 wherein the filter includes a plurality of the first type of resonators with a temperature compensating layer, at least two of the plurality of first type of resonators having different thicknesses of their respective temperature compensating layers, the plurality of the first type of resonators including a plurality of shunt resonators, a thickness of the temperature compensating layer of the shunt resonator most responsible for raising the skirt steepness or the channel insertion loss of the filter being thicker than that of other shunt resonators of the first type.

* * * * *